(12) United States Patent
Kadoguchi

(10) Patent No.: US 9,224,663 B2
(45) Date of Patent: Dec. 29, 2015

(54) SEMICONDUCTOR DEVICE

(71) Applicant: Takuya Kadoguchi, Toyota (JP)

(72) Inventor: Takuya Kadoguchi, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/096,172

(22) Filed: Dec. 4, 2013

(65) Prior Publication Data

US 2014/0159230 A1 Jun. 12, 2014

(30) Foreign Application Priority Data

Dec. 10, 2012 (JP) ................................. 2012-269822

(51) Int. Cl.
*H01L 23/051* (2006.01)
*H01L 23/31* (2006.01)
*H01L 23/36* (2006.01)

(52) U.S. Cl.
CPC .......... *H01L 23/051* (2013.01); *H01L 23/3107* (2013.01); *H01L 23/36* (2013.01); *H01L 2224/32245* (2013.01); *H01L 2224/33181* (2013.01); *H01L 2224/48247* (2013.01); *H01L 2224/73215* (2013.01); *H01L 2224/73265* (2013.01); *H01L 2924/1305* (2013.01); *H01L 2924/13055* (2013.01); *H01L 2924/13091* (2013.01)

(58) Field of Classification Search
CPC .................................................. H01L 23/562
USPC .................................. 257/734, 330, 691, 706
See application file for complete search history.

(56) References Cited

U.S. PATENT DOCUMENTS

| | | | | |
|---|---|---|---|---|
| 5,895,972 | A * | 4/1999 | Paniccia | 257/706 |
| 6,803,667 | B2 * | 10/2004 | Okura et al. | 257/792 |
| 7,215,020 | B2 * | 5/2007 | Nakase et al. | 257/706 |
| 8,049,309 | B2 * | 11/2011 | Grivna et al. | 257/620 |

(Continued)

FOREIGN PATENT DOCUMENTS

| | | |
|---|---|---|
| JP | 2003-133329 | 5/2003 |
| JP | 3812549 | 6/2006 |

(Continued)

OTHER PUBLICATIONS

Zhenyin Yang et al., Comparison of Au and Au—Ni Alloys as Contact MAterials for MEMS Switches, Journal of Microelectromechanical Systems, vol. 18, No. 2, p. 290, Apr. 2009.*

(Continued)

*Primary Examiner* — Kenneth Parker
*Assistant Examiner* — Young W Kim
(74) *Attorney, Agent, or Firm* — Finnegan, Henderson, Farabow, Garrett & Dunner, LLP

(57) ABSTRACT

A semiconductor device includes a semiconductor element in the form of a flat plate that has opposed first and second surfaces, an insulating layer that covers control wiring located on the first surface side of the semiconductor element, a metal block that is bonded to the first surface side of the semiconductor element via a solder layer, and a protective film that is formed between the metal block and the insulating layer, the protective film having a hardness equal to or greater than a hardness of the metal block. When viewed from the first surface side, the protective film is formed in an area at least including a position where an edge portion of the metal block and the control wiring cross each other.

6 Claims, 9 Drawing Sheets

(56) References Cited

U.S. PATENT DOCUMENTS

| | | |
|---|---|---|
| 2003/0052400 A1 | 3/2003 | Okura et al. |
| 2005/0151254 A1 | 7/2005 | Narazaki |
| 2005/0170555 A1 | 8/2005 | Hirano et al. |
| 2011/0042741 A1* | 2/2011 | Fukuoka et al. ............. 257/330 |
| 2012/0235291 A1 | 9/2012 | Uchida et al. |

FOREIGN PATENT DOCUMENTS

| | | |
|---|---|---|
| JP | 3829860 | 7/2006 |
| JP | 2007-109880 | 4/2007 |
| JP | 4073876 | 2/2008 |
| JP | 2011-66371 | 3/2011 |
| JP | 2011-066377 | 3/2011 |
| JP | 2012-195500 | 10/2012 |

OTHER PUBLICATIONS

English language abstract of JP 2005-019829 dated Jan. 20, 2005 (corresponding to JP 3812549 dated Jun. 9, 2006).

* cited by examiner

SEMICONDUCTOR DEVICE

INCORPORATION BY REFERENCE

The disclosure of Japanese Patent Application No. 2012-269822 filed on Dec. 10, 2012 including the specification, drawings and abstract is incorporated herein by reference in its entirety.

BACKGROUND OF THE INVENTION

1. Field of the Invention

The present invention relates to a semiconductor device suitably applied to, for example, vehicles such as passenger cars, trucks, or buses, household equipment, or industrial equipment.

2. Description of Related Art

There are semiconductor devices obtained by packaging a semiconductor element such as an insulated gate bipolar transistor (IGBT) or a MOSFET into a stacked structure together with a metal block and a radiator plate. For example, an emitter electrode made of aluminum is formed on the surface of a semiconductor substrate on which an IGBT is formed, a gate wiring layer is formed via a LOCOS oxide film and an insulating film, and the gate wiring layer is covered with a protective film to prevent short-circuiting with the emitter electrode.

When a crack develops in the protective film of such a semiconductor device for some reason, it is no longer possible to ensure the insulation mentioned above. Accordingly, as disclosed in, for example, Japanese Patent Application Publication No. 2011-066371 (JP 2011-066371 A), a second protective film made of a material different from that of a first protective film formed on the gate wiring of a semiconductor element is formed around the first protective film, thereby preventing a crack that has developed in the second protective film from reaching the first protective film.

However, the above-mentioned technique has the following problem. That is, depending on the material of the metal block stacked on the semiconductor element, a crack develops in the protective film owing to burrs generated in the manufacturing process of the metal block, which again may make it impossible to ensure insulation.

SUMMARY OF THE INVENTION

The present invention provides a semiconductor device that can ensure insulation between the control and main electrodes of a semiconductor element with greater reliability.

An aspect of the present invention relates to a semiconductor device including a semiconductor element in a form of a flat plate, the semiconductor element having opposed first and second surfaces, a control wiring, an insulating layer that covers the control wiring located on a first surface side of the semiconductor element, a solder layer, a metal block that is bonded to the first surface side of the semiconductor element via the solder layer, and a protective film that is formed between the metal block and the insulating layer, the protective film having a hardness equal to or greater than a hardness of the metal block. When viewed from the first surface side, the protective film is formed at least at a position where an edge portion of the metal block and the control wiring cross each other.

When viewed from the first surface side, the protective film may be formed in a predetermined area including a position where an edge portion of the metal block and the control wiring cross each other. A main electrode to which the solder layer is bonded may include a plurality of electrode portions, the control wiring may be located between adjacent electrode portions of the plurality of electrode portions, the insulating layer may have a plurality of openings corresponding to the plurality of electrode portions, and a bonding film between the solder layer and each of the plurality of electrode portions may be formed in each of the plurality of openings. The bonding film and the protective film may be formed integrally. The protective film may be formed of the same material as the bonding film.

According to the present invention, even when the metal block has burrs that project to the second surface side, the control wiring of the semiconductor element is protected by the protective film having a hardness equal to or greater than the hardness of the metal block, thereby preventing the burrs from reaching the control wiring. As a result, it is possible to prevent short-circuiting between the main electrode of the semiconductor element and the control electrode to which the control wiring is connected, thereby ensuring insulation.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1A:
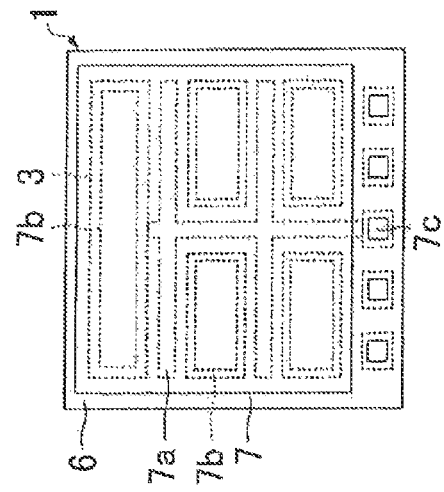
FIGS. 1A to 1D are schematic views of various layers of a semiconductor device according to the first embodiment of the present invention, illustrating various components of the semiconductor device as seen from the front surface side of the semiconductor device.

FIGS. 1A to 1D each illustrate a semiconductor device 1 as viewed from the front surface side. That is, the back surface of the semiconductor device 1 corresponds to the back side of the plane of FIGS. 1A to 1D. In this specification, the side lying in the plane of figures will be regarded as the front side of each component, and the side lying in the hack side of the plane of figures will be regarded as the hack side of each component. As illustrated in FIG. 1A, in the semiconductor device 1 according to the first embodiment, a plurality of (five in this example) emitter electrodes 3, an Al pattern 4, and a gate electrode pad 5 (control electrode pad) are formed on the front surface side of a semiconductor element 2 mainly made of a silicon substrate. The emitter electrodes 3 are provided in a divided configuration corresponding to a collector electrode (not illustrated) formed on the back surface side. The Al pattern 4 is located between adjacent ones of the emitter electrodes 3. The Al pattern 4 is made of aluminum and is in the form of a footpath. The pads provided in parallel to the gate electrode pad 5 are pads connected to electrodes other than a gate electrode.

Like the Al pattern 4, the emitter electrodes 3 and the gate electrode pad 5 are made of aluminum (Al). The emitter electrodes 3 are electrically connected to each other inside the semiconductor element 2. The gate electrode pad 5 is connected via the Al pattern 4 to a gate electrode corresponding to each of the emitter electrodes 3 formed within the silicon substrate of the semiconductor element 2.

Figure 1B:
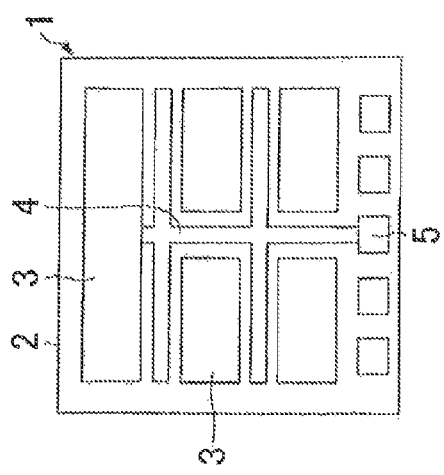

As illustrated in FIG. 1B, an insulating material pattern 6 (insulating layer) is stacked on the front sides of the emitter electrodes 3 and the Al pattern 4. The insulating material pattern 6 includes a plurality of (five in this example) openings 6a and a plurality of openings 6b. The openings 6a expose the five emitter electrodes 3 to the front side except for their edge portions. Likewise, the openings 6b expose the gate electrode pad 5 and the other pads except for their edge portions. The lines (dotted lines) on the outer side of the double lines indicating the openings 6a and 6b in FIG. 1B indicate the contour lines of the emitter electrodes 3, gate electrode pad 5, and other pads.

Figure 1C:
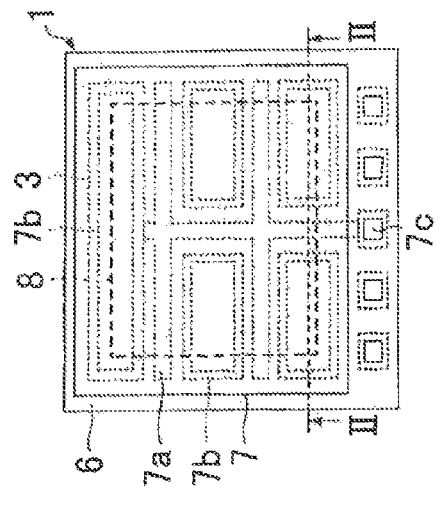

As illustrated in FIG. 1C, a Ni plating pattern 7 is stacked and formed on the front side of the insulating material pattern 6. The Ni plating pattern 7 includes a protective film 7a, a soldering electrode 7b (bonding film), and a pad bonding film 7c. The protective film 7a covers an area including at least the front side of the portion where the Al pattern 4 is located. The soldering electrode 7b blocks and covers each of the openings 6a. The pad bonding film 7c blocks and covers each of the openings 6b. Of these, the protective film 7a and the soldering electrode 7b are formed integrally. As indicated by broken boxes in FIGS. 1D and 1B, the outer edges (edge portions) as viewed from the front side of a metal block 8 that is a block electrode are positioned inside the five openings 6a so as to cross the Al pattern 4.

Figure 1D:
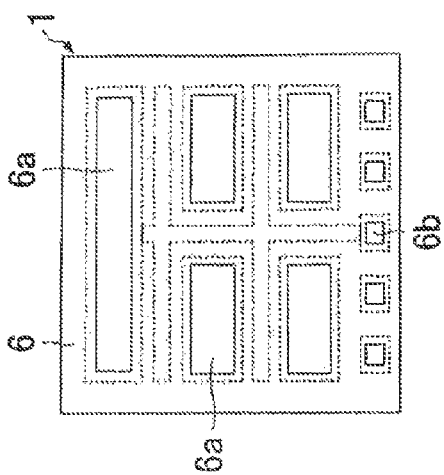
Figure 2:
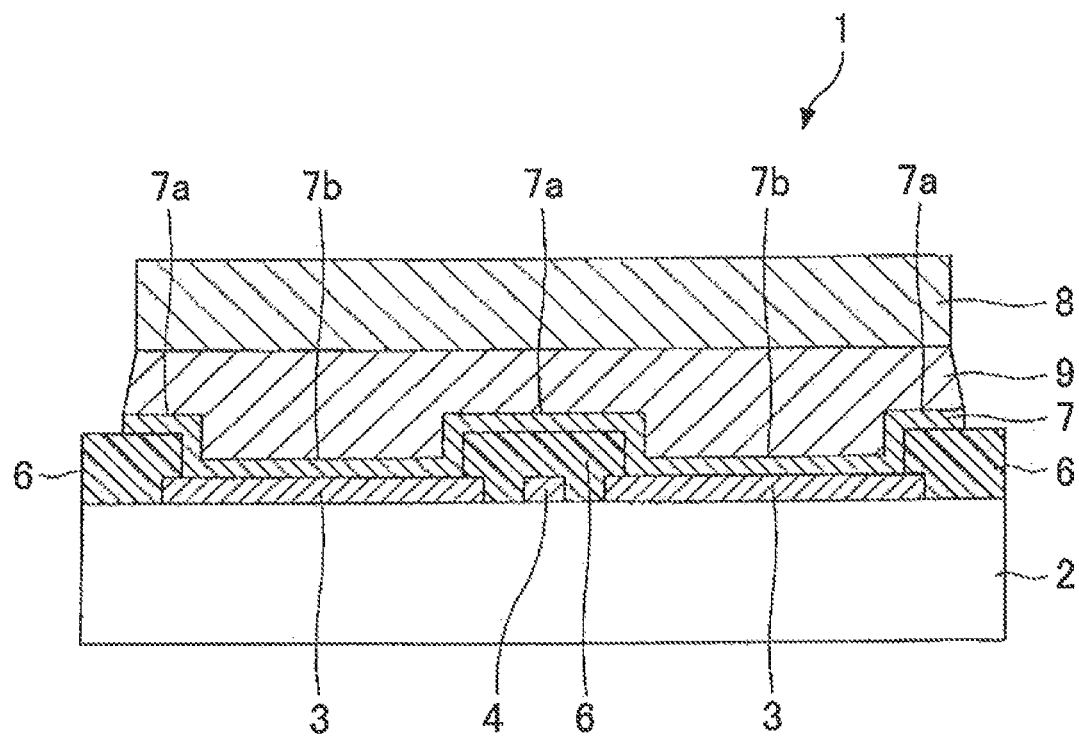
FIG. 2 schematically illustrates how various components are stacked in cross-sectional view taken along a line II-II in FIG. 1D of the semiconductor device according to the first embodiment.

As illustrated in FIG. 2 that is a cross-sectional view taken along a line II-II in FIG. 1D, the Ni plating pattern 7 is provided in order to bond the metal block 8, which is arranged on the front side of the Ni plating pattern 7, to the front side of the semiconductor element 2 via a front-side solder layer 9 (solder layer). The protective film 7a is formed on the front side of the insulating material pattern 6, and the soldering electrode 7b is formed at the bottom of the openings 6a, that is, on the front side of the emitter electrodes 3. Consequently, a step extending in the front-to-back direction exists between the protective film 7a and the soldering electrode 7b. In other words, the protective film 7a covers an area around the insulating material pattern 6 which has a step.

The metal block 8 is obtained by applying Ni plating to a copper-based base material. The Ni plating pattern 7 has a hardness equivalent to that of the metal block 8. As for the method of forming each of an Al pattern and a Ni pattern, any suitable one of plating, sputtering, vapor deposition, and printing may be used as appropriate. As for the patterning method, any suitable one of a method using a resist, a method using a mechanical mask, and a method that performs patterning after electrode formation and removes unnecessary portions by etching or the like may be used as appropriate.

Figure 3:
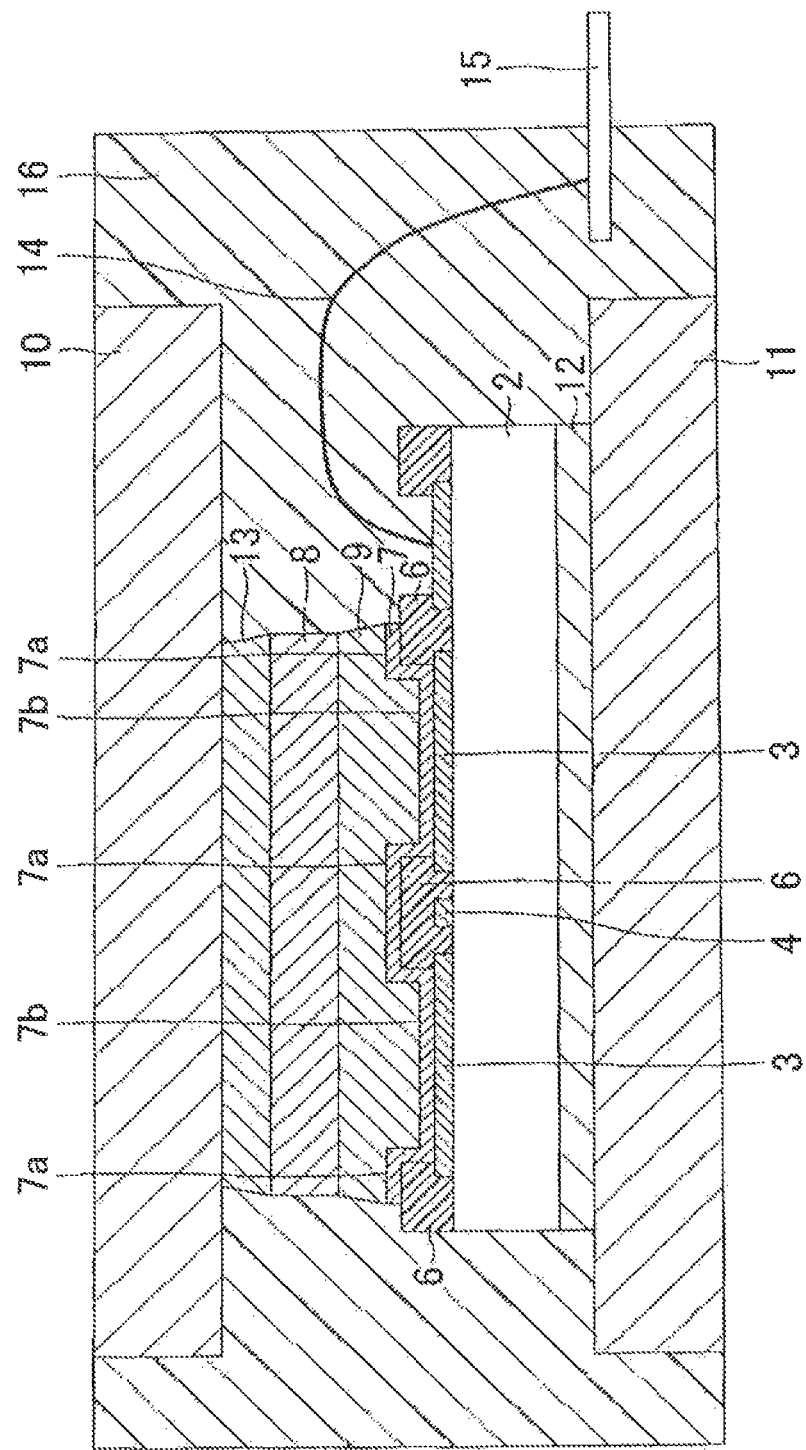
FIG. 3 schematically illustrates a general configuration of the semiconductor device according to the first embodiment.

Next, a general configuration of the semiconductor device 1 according to the first embodiment will be described with reference to FIG. 3. The semiconductor device 1 according to the first embodiment cools the semiconductor element 2 by means of a heat spreader 10 that is a front-side radiator plate, and a heat spreader 11 that is a back-side radiator plate. The collector electrode (not illustrated) of the semiconductor element 2 and the heat spreader 11 are bonded to each other via a back-side soldering layer 12, thereby establishing thermal/mechanical/electrical connection.

Thermal/mechanical/electrical connection between the emitter electrodes 3 of the semiconductor element 2 and the heat spreader 10 is established via the soldering electrode 7b, the front-side solder layer 9, the metal block 8, and a third solder layer 13. The pad bonding film 7c is connected to a control terminal 15 via an Al wire 14. The semiconductor device 1 is sealed with a sealing resin 16, except for the front side of the heat spreader 10, the control terminal 15, and the back side of the heat spreader 11.

Figure 4:
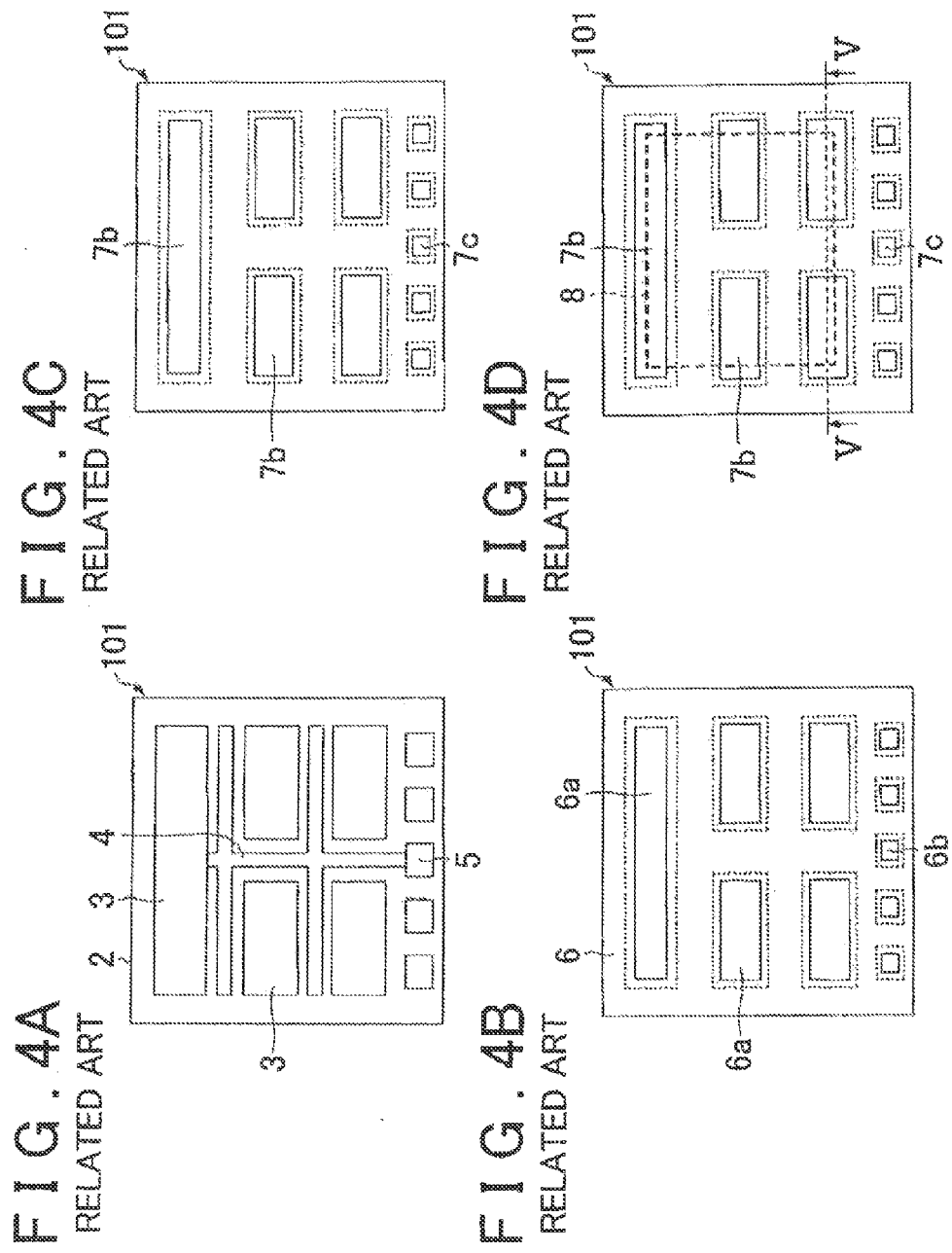
FIGS. 4A to 4D are schematic views of various layers of a semiconductor device according to related art, illustrating various components of the semiconductor device as seen from the front surface side of the semiconductor device.

As a comparative example, a semiconductor device 101 according to related art will be described with reference to FIGS. 4A to 4D and FIG. 5. As illustrated in FIG. 4A, the emitter electrodes 3, the Al pattern 4, and the gate electrode pad 5 which are included in the semiconductor element of the semiconductor device 101 are formed in the same manner as those of the semiconductor device 1 according to the first embodiment. As illustrated in FIG. 4B, the insulating material pattern 6, and the openings 6a and 6b are also configured in the same manner as those of the semiconductor device 1.

Figure 5:
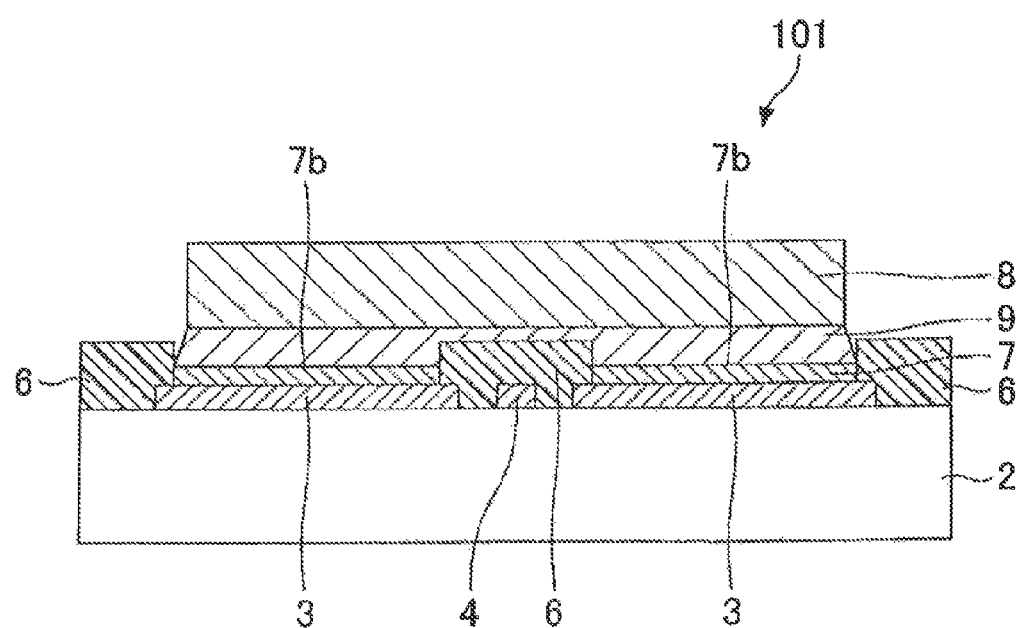
FIG. 5 schematically illustrates how various components are stacked in cross-sectional view taken along a line V-V in FIG. 4D of the semiconductor device according to related art.

As illustrated in FIG. 4C, the semiconductor device 101 differs from the semiconductor device 1 in that the Ni plating pattern 7 includes only the soldering electrode 7b and the pad bonding film 70 and does not include the protective film 7a. That is, as illustrated in FIG. 5 that is a cross-sectional view taken along a line V-V in FIG. 4D, the Ni plating pattern 7 exists only on the front side of the emitter electrodes 3 excluding their edge portions. The relationship between the Ni plating pattern 7 and the Al pattern 4 in a cross-section perpendicular to the extending direction of the Al pattern 4, other than the cross-section taken along a line V-V in FIG. 4D, is also the same as that illustrated in FIG. 5.

Figure 6A:
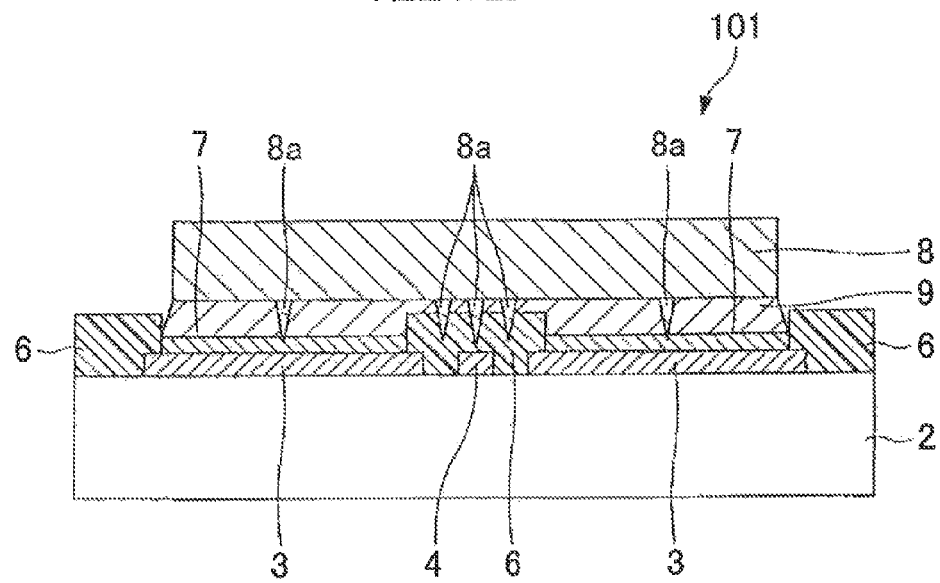
FIGS. 6A and 6B schematically illustrate operational advantages obtained by the semiconductor device according to the first embodiment, on the basis of comparison with the semiconductor device according to related art.

That is, in the semiconductor device 101 according to the comparative example, the protective film 7a is not arranged on the front side of the Al pattern 4 located on the back side of the outer edges of the metal block 8 indicated by a broken line in FIG. 4D. Consequently, in a case where burrs 8a generated when the metal block 8 is formed by punching exist on the outer edges of the metal block 8 as illustrated in FIG. 6A, there is a possibility that the burrs 8a may penetrate the front-side solder layer 9 and reach the Al pattern 4.

Figure 6B:
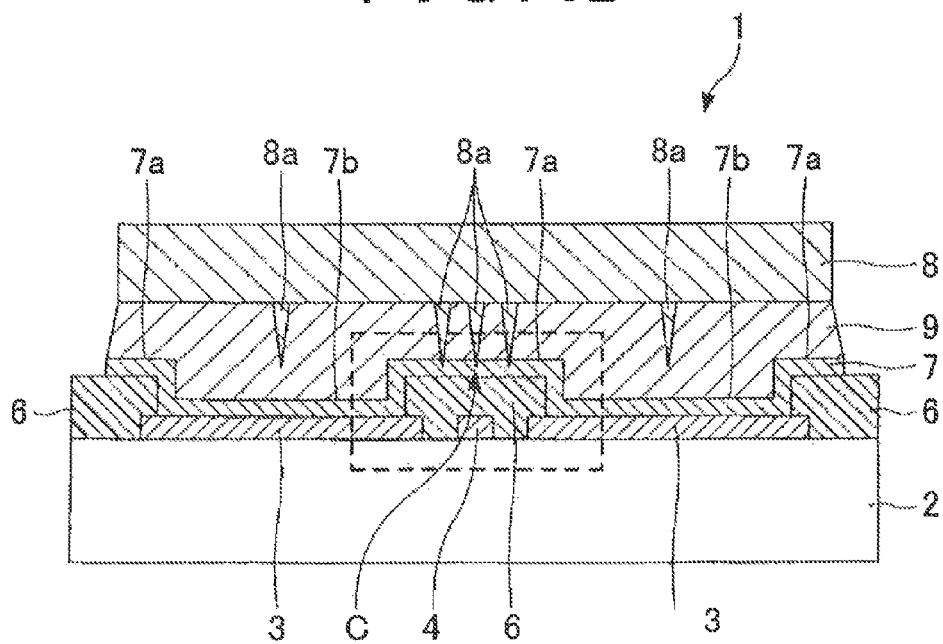

In the semiconductor device 1 according to the first embodiment, the Ni plating pattern 7 has the protective film 7a provided in areas including at least the positions where the outer edges of the metal block 8 and the Al pattern cross each other as viewed from the front side. In addition, the Ni plating pattern 7 has a hardness equivalent to that of the burrs 8a. Consequently, as indicated by a portion C in FIG. 6B, the burrs 8a do not penetrate the protective film 7a, and hence do not reach the Al pattern 4 that is gate electrode wiring.

As a result, short-circuiting of an insulating portion including the Al pattern 4 and the insulating material pattern 6 can be prevented. In addition, short-circuiting between the emitter electrodes 3 and the Al pattern 4 that are at different potentials can be prevented, thereby ensuring insulation between main and control electrodes. Moreover, when mounting the metal block 8, the need to check whether or not short-circuiting due to the burrs 8a is occurring, and the need to check for the very presence of the burrs 8a can be obviated, thereby achieving a reduction in cost.

By forming the Ni plating pattern 7 as a single flat plate-like pattern integrally including the protective film 7a and the soldering electrode 7b as in the first embodiment, the manufacturing process for the Ni plating pattern 7 can be further simplified.

In the semiconductor device 1 according to the first embodiment mentioned above, the protective film 7a is formed in the shape of a rectangular flat plate larger than the outer edges of the metal block 8. However, the protective film 7a may be arranged in a more limited area in accordance with the distribution of the burrs 8a that may exist on the edge portions of the metal block 8. Hereinafter, this configuration will be described with reference to the second embodiment.

Figure 7A:
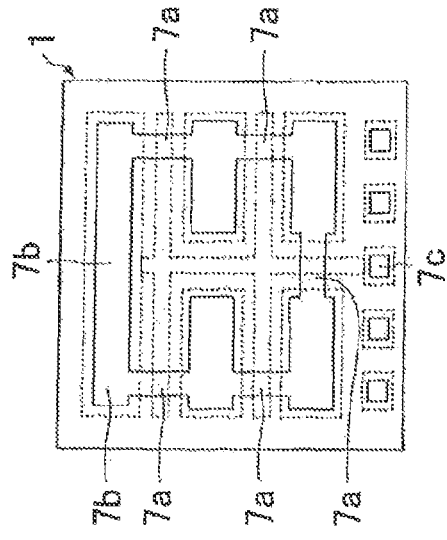
FIGS. 7A to 7D are schematic views of various layers of a semiconductor device according to the second embodiment of the present invention, illustrating various components of the semiconductor device as seen from the front surface side of the semiconductor device.
Figure 7B:
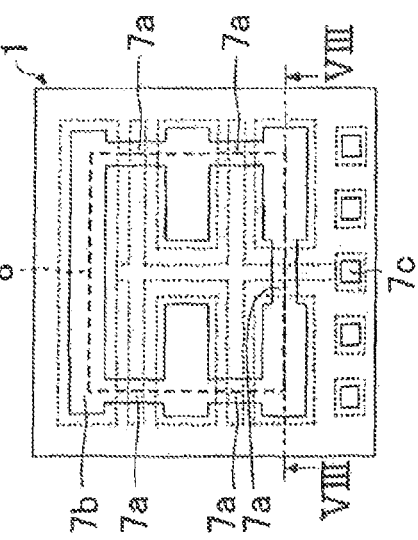

As illustrated in FIG. 7A, the semiconductor device 1 according to the second embodiment is the same as the semiconductor device 1 according to the first embodiment in how the emitter electrodes 3, the Al pattern 4, and the gate electrode pad 5 included in the semiconductor element 2 are formed. The insulating material pattern 6, and the openings 6a and 6b are also configured in the same manner as those of the semiconductor device 1 according to the first embodiment, as illustrated in FIG. 7B.

Figure 7C:
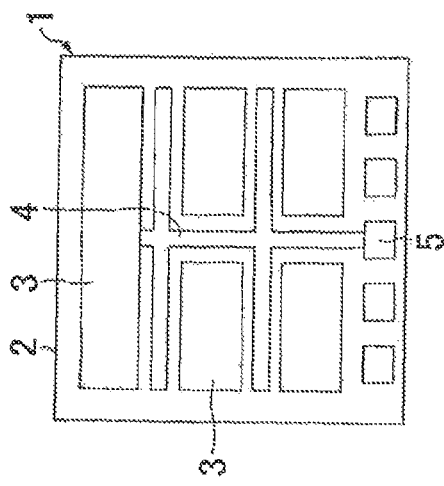
Figure 7D:
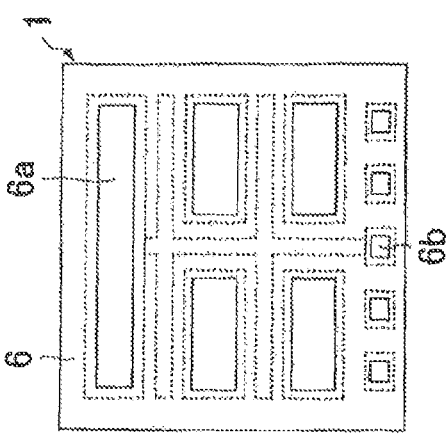
Figure 8:
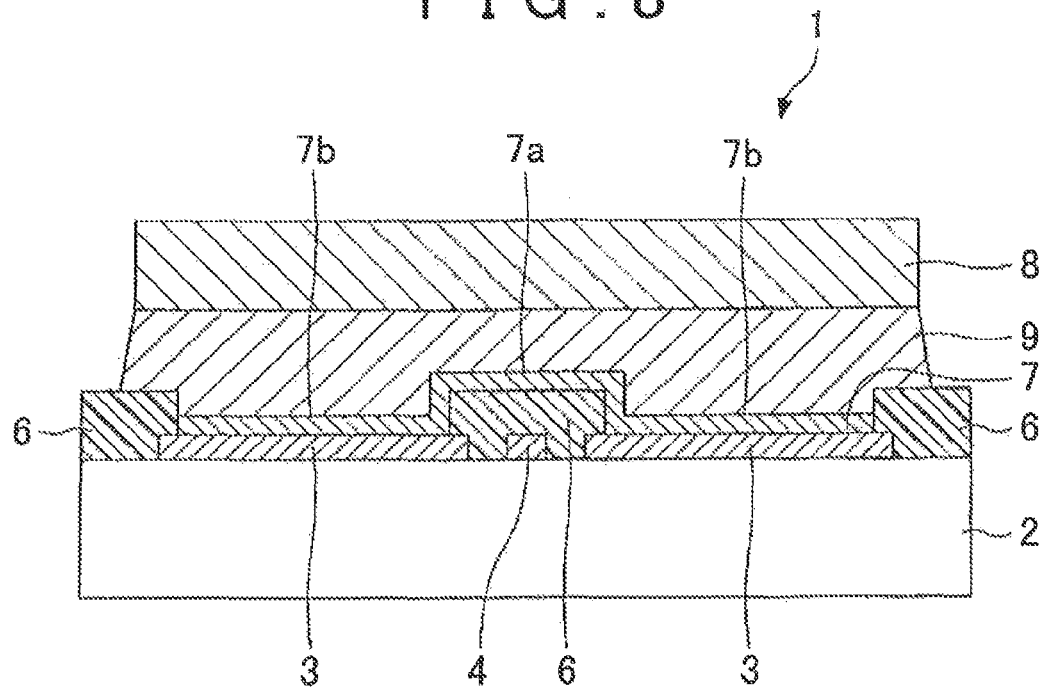
FIG. 8 schematically illustrates how various components are stacked in cross-sectional view taken along a line VIII-VIII in FIG. 7D of the semiconductor device according to the second embodiment.

The semiconductor device 1 according to the second embodiment differs from the first embodiment in that, as illustrated in FIGS. 7C and 7D, the protective film 7a of the Ni plating pattern 7 is provided in a limited predetermined area in the shape of a rectangular frame with a predetermined width which lies along the outer edges (edge portions) of the metal block 8, and the protective film 7a is arranged so as to interconnect adjacent sections of the soldering electrode 7b. The pad bonding film 7c is the same as that in the first embodiment. The cross-section taken along a line VIII-VIII in FIG. 7D is as illustrated in FIG. 8. As compared with FIG. 2, in FIG. 8, there is no protective film 7a formed on the front side and stepped portion of the insulating material pattern 6 located at the left and right ends within the cross-section.

That is, in the second embodiment, the protective film 7a is provided in a total of the following five locations: a pair of vertically elongated rectangular frame-shaped portions that vertically connect the portions near the left and right ends of the soldering electrode 7b located at the top in FIG. 7C and having a long length and the left and right ends of the soldering electrodes 7b located in the middle and having a short length; a pair of vertically elongated rectangular frame-shaped portions that vertically connect the portions near the left and right ends of the short soldering electrodes 7b located in the middle and the left and right ends of the soldering electrodes 7b located at the bottom and having a short length; and a single horizontally elongated rectangular frame-shaped portion that interconnects the short soldering electrodes 7b located at the bottom.

Figure 9:
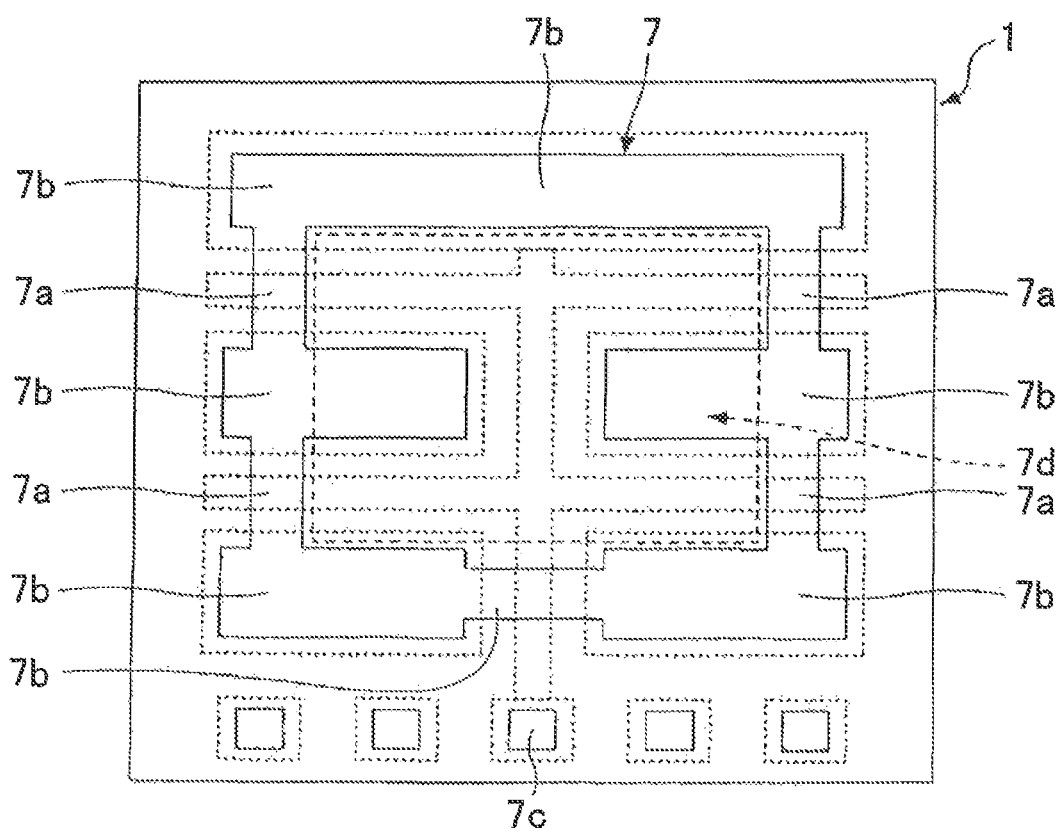
FIG. 9 schematically illustrates openings, which are formed inside the outer edges of a metal block, of a protective film of the semiconductor device according to the second embodiment.

Consequently, the Ni plating pattern 7 has a pair of openings 7d provided in a portion where the inside of the inner edges of the long soldering electrodes 7b at the top, the soldering electrode 7b at the bottom, and two pairs of left and right protective films 7a, and the soldering electrodes 7b in the middle overlap, as illustrated in FIG. 9. The pair of openings 7d reaches the front-side solder layer 9 on the front side from the insulating material pattern 6 on the back side.

In the semiconductor device 1 according to the second embodiment mentioned above, as in the first embodiment, the Ni plating pattern 7 includes the protective film 7a, and the Ni plating pattern 7 has a hardness equivalent to that of the burrs 8a. Therefore, the tip of the burrs 8a can be received by the protective film 7a to prevent penetration of the burrs 8a, thereby protecting the Al pattern 4 that is gate electrode wiring.

As a result, according to the second embodiment as well, short-circuiting of an insulating portion including the Al pattern 4 and the insulating material pattern 6 can be prevented, in addition, short-circuiting between the emitter electrodes 3 and the Al pattern 4 that are at different potentials can be prevented, thereby ensuring insulation between main and control electrodes. Moreover, as in the first embodiment, when mounting the metal block 8, the need to check whether or not short-circuiting due to the burrs 8a is occurring, and the need to check for the very presence of the burrs 8a can be obviated, thereby achieving a reduction in cost.

Forming the Ni plating pattern 7 so as to have the openings 7d as in the second embodiment has the following effect. That is, in the event that "degas" occurs in a reflow that is a soldering operation, a baking process, or the like because the insulating material pattern 6 is made of a resin material, the degas can be released to the outside from the openings 7d during reflow via the front-side solder layer 9 that has been molten at that time.

In the second embodiment mentioned above, the protective film 7a is formed as a part of the Ni plating pattern 7 as in the first embodiment. However, the protective film 7a and the soldering electrode 7b may be formed as independent patterns.

Other than forming the protective film as a part of the Ni plating pattern 7, the protective film may be formed using a different material (for example, a Cu-based alloy, an Al-based alloy; Pd, Ag, Au, or Pt) that has a hardness greater than that of the surface of the metal block 8. Hereinafter, this configuration will be described with reference to the third embodiment.

Figure 10:
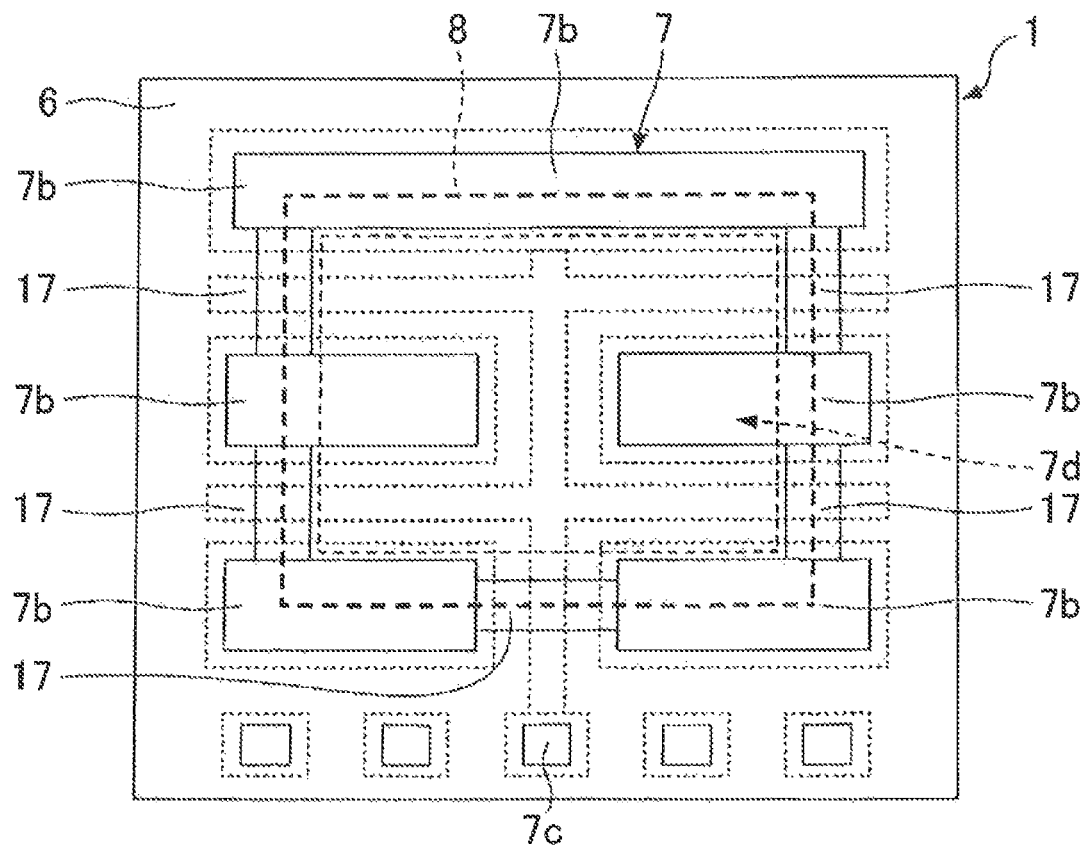
FIG. 10 schematically illustrates how various components are arranged in a semiconductor device according to the third embodiment of the present invention.

As illustrated in FIG. 10, the semiconductor device 1 according to the third embodiment is also the same as the second embodiment in that the Ni plating pattern 7 has the soldering electrode 7b and the pad bonding film 7c. However, in the third embodiment, instead of the protective film 7a according to the second embodiment, a protective film 17 is made of a material different from that of the Ni plating pattern 7. As for the method of forming and patterning the protective film 17, any method described above with reference to the first embodiment may be selected as appropriate.

According to the third embodiment, as in the semiconductor device 1 according to the second embodiment, it is possible to prevent short-circuiting of an insulating portion, and obviate the need to check for the presence of short-circuiting and the need to check for the presence of the burrs 8a. Moreover, because the openings 7d are formed in the same manner as in the second embodiment, "degas" generated from the insulating material pattern 6 can be discharged.

While preferred embodiments of the present invention have been described above in detail, the present invention is not limited to the above-mentioned embodiments. Various modifications and substitutions may be made to the above-mentioned embodiments without departing from the scope of the present invention.

For example, as for how to divide the emitter electrode with respect to the collector electrode, the emitter electrode may be divided into not only five electrodes but also any other number of electrodes as long as it is possible to ensure controllability of the drive by the gate electrode. In this case, the configurations of the openings of the insulating material pattern and of the Al pattern are changed accordingly as appropriate.

The embodiments of the present invention are applicable to semiconductor devices including gate-drive semiconductor elements, and are applicable to both IGBTs and MOSFETs. As described above in detail, the embodiments of the present invention can prevent burrs on the edge portions of the metal block from breaking through the insulating material and reaching the Al pattern that forms control wiring, thereby providing secure insulation between control and main electrodes.

Moreover, the embodiments of the present invention can obviate the need to check for insulation or burrs to thereby achieve a reduction in cost. Therefore, the embodiments of the present invention find utility when applied to various kinds of semiconductor-related devices having the above-mentioned characteristics. Of course, the embodiments of the present invention also find utility when applied to semiconductor modules applied to inverters or the like of various vehicles such as passenger cars, trucks, and buses.

What is claimed is:

1. A semiconductor device comprising:
    a semiconductor element in a form of a flat plate, the semiconductor element having opposed first and second surfaces;
    a control wiring;
    an insulating layer that covers the control wiring located on a first surface side of the semiconductor element;
    a solder layer;
    a metal block that is bonded to the first surface side of the semiconductor element via the solder layer; and
    a protective film that is formed between the metal block and the insulating layer, the protective film having a hardness equal to or greater than a hardness of the metal block,
    wherein:
        when viewed from the first surface side, the protective film is formed at least at a position where an edge portion of the metal block and the control wiring cross each other,
        the protective film is provided in a predetermined area in a shape of a rectangular frame with a predetermined width, which lies along an outer edge of the metal block, and
        the protective film defines a plurality of openings that are configured to release degas from the insulating layer.

2. The semiconductor device according to claim 1, wherein when viewed from the first surface side, the protective film is formed in a predetermined area including the position where the edge portion of the metal block and the control wiring cross each other.

3. The semiconductor device according to claim 2, further comprising:
    a main electrode to which the solder layer is bonded and which includes a plurality of electrode portions; and
    a bonding film,
    wherein the control wiring is located between adjacent electrode portions of the plurality of electrode portions;
    the insulating layer has a plurality of openings corresponding to the plurality of electrode portions; and
    the bonding film is formed in each of the plurality of openings and is located between the solder layer and each of the plurality of electrode portions.

4. The semiconductor device according to claim 3, wherein the bonding film and the protective film are formed integrally.

5. The semiconductor device according to claim 3, wherein the protective film is formed of the same material as the bonding film.

6. The semiconductor device according to claim 1, wherein the protective film is formed using a material selected from a group consisting of a Cu-based alloy, an Al-based alloy, Pd, Ag, Au, and Pt.

* * * * *